United States Patent
Ono (10) Patent No.: US 8,009,275 B2
(45) Date of Patent: Aug. 30, 2011

(54) MOVABLE STAGE APPARATUS

(75) Inventor: Kazuyuki Ono, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 684 days.

(21) Appl. No.: 12/045,818

(22) Filed: Mar. 11, 2008

(65) Prior Publication Data

US 2008/0174755 A1    Jul. 24, 2008

Related U.S. Application Data

(62) Division of application No. 10/757,387, filed on Jan. 15, 2004, now Pat. No. 7,361,910.

(30) Foreign Application Priority Data

Jan. 27, 2003 (JP) .................................. 2003-017260

(51) Int. Cl.
*G03B 27/62* (2006.01)
(52) U.S. Cl. ........................................................ 355/75
(58) Field of Classification Search .................. 355/56, 355/66, 75; 359/509; 250/492.2; 74/471 XY
See application file for complete search history.

(56) References Cited

U.S. PATENT DOCUMENTS

| | | | |
|---|---|---|---|
| 5,040,431 A | 8/1991 | Sakino et al. | 74/479 |
| 5,440,397 A | 8/1995 | Ono et al. | 356/401 |
| 5,523,843 A | 6/1996 | Yamane et al. | 356/363 |
| 5,684,856 A | 11/1997 | Itoh et al. | 378/34 |
| 5,858,587 A | 1/1999 | Yamane et al. | 430/22 |
| 5,864,389 A | 1/1999 | Osanai et al. | 355/53 |
| 5,886,432 A | 3/1999 | Markle | 310/12 |
| 5,925,956 A | 7/1999 | Ohzeki | 310/90.5 |
| 6,040,675 A | 3/2000 | Ono | 318/649 |
| 6,072,183 A | 6/2000 | Itoh et al. | 250/492.2 |
| 6,259,174 B1 | 7/2001 | Ono | 310/13 |
| 6,281,655 B1 | 8/2001 | Poon et al. | 318/649 |
| 6,639,333 B1 | 10/2003 | Kamata et al. | 310/12 |
| 6,717,159 B2 | 4/2004 | Novak | 250/492.2 |
| 6,721,389 B2 | 4/2004 | Van Der Werf et al. | 378/34 |
| 6,770,890 B2 | 8/2004 | Tanaka | 250/442.11 |
| 6,781,673 B2 | 8/2004 | Moors et al. | 355/76 |
| 7,075,620 B2 | 7/2006 | Van Der Werf et al. | 355/53 |
| 7,139,065 B2 | 11/2006 | Ono | 355/72 |

(Continued)

FOREIGN PATENT DOCUMENTS

EP    1 143 492 A1    10/2001

(Continued)

OTHER PUBLICATIONS

Japanese Office Action dated Jan. 9, 2009, issued in corresponding Japanese patent application No. 2003-017260.

(Continued)

*Primary Examiner* — Edward J. Glick
*Assistant Examiner* — Deoram Persaud
(74) *Attorney, Agent, or Firm* — Fitzpatrick, Cella, Harper & Scinto (57) ABSTRACT

An exposure apparatus that includes a movable stage apparatus. The movable stage apparatus includes a master stage on which a reflecting master is to be mounted, in which, when a space is divided by a plane including a reflection surface of the master, a guide surface to guide movement of the master stage is arranged in a space opposite to a space where an exposure light beam to be reflected by the master passes.

10 Claims, 8 Drawing Sheets

U.S. PATENT DOCUMENTS

| | | |
|---|---|---|
| 7,459,690 B2 | 12/2008 | Van Der Werf et al. ....... 250/372 |
| 2002/0037461 A1 | 3/2002 | Van Der Werf et al. ........ 430/30 |
| 2002/0096647 A1 | 7/2002 | Moors et al. ............... 250/492.1 |
| 2002/0109828 A1 | 8/2002 | Moors et al. ...................... 355/76 |
| 2002/0140298 A1 | 10/2002 | Maruyama ...................... 310/54 |
| 2002/0180312 A1* | 12/2002 | Tanaka .......................... 310/328 |
| 2003/0067592 A1* | 4/2003 | Tim Poon et al. ............... 355/75 |
| 2003/0098962 A1* | 5/2003 | Kubo .............................. 355/72 |
| 2004/0080727 A1* | 4/2004 | Emoto ............................ 355/30 |
| 2004/0145713 A1 | 7/2004 | Ono ................................ 355/53 |
| 2004/0190677 A1 | 9/2004 | Van Der Werf et al. ........ 378/34 |
| 2005/0185167 A1* | 8/2005 | Kimura .......................... 355/75 |
| 2006/0098184 A1* | 5/2006 | Shibazaki ....................... 355/75 |
| 2006/0219931 A1 | 10/2006 | Van Der Werf et al. ....... 250/372 |

FOREIGN PATENT DOCUMENTS

| | | |
|---|---|---|
| JP | 10-12539 | 1/1998 |
| JP | 2000-12453 | 1/2000 |
| JP | 2002-124463 | 4/2002 |

OTHER PUBLICATIONS

Kim, Won-jong, et al. "High-precision magnetic levitation stage for photolithography," Precision Engineering, 22:66-77, 1998.

Chen, K.-S, et al. "Design and control for an electromagnetically driven X-Y-θ stage," Precision Engineering, 26 (2002) 355-369.

* cited by examiner

MOVABLE STAGE APPARATUS

This application is a divisional application of copending U.S. patent application Ser. No. 10/757,387, filed Jan. 15, 2004.

This application also claims priority from Japanese Patent Application No. 2003-17260, filed on Jan. 27, 2003, which is hereby incorporated by reference herein.

FIELD OF THE INVENTION

The present invention relates to a lithography technique for manufacturing semiconductor devices, or the like, and, more particularly, to a technique for projecting a reticle pattern onto a limited band-like rectangular or arcuate region on a wafer and scanning a reticle and the wafer synchronously in a one-dimensional direction, so that the reticle pattern is transferred onto the wafer.

BACKGROUND OF THE INVENTION

Conventionally, the photolithography process as one of processes for manufacturing semiconductor devices represented by semiconductor integrated circuits uses various types of exposure apparatuses to expose a circuit pattern, or the like, formed on a mask or reticle (to be referred to as a reticle hereinafter) onto a wafer coated with a photosensitive agent (photoresist).

Figure 6:
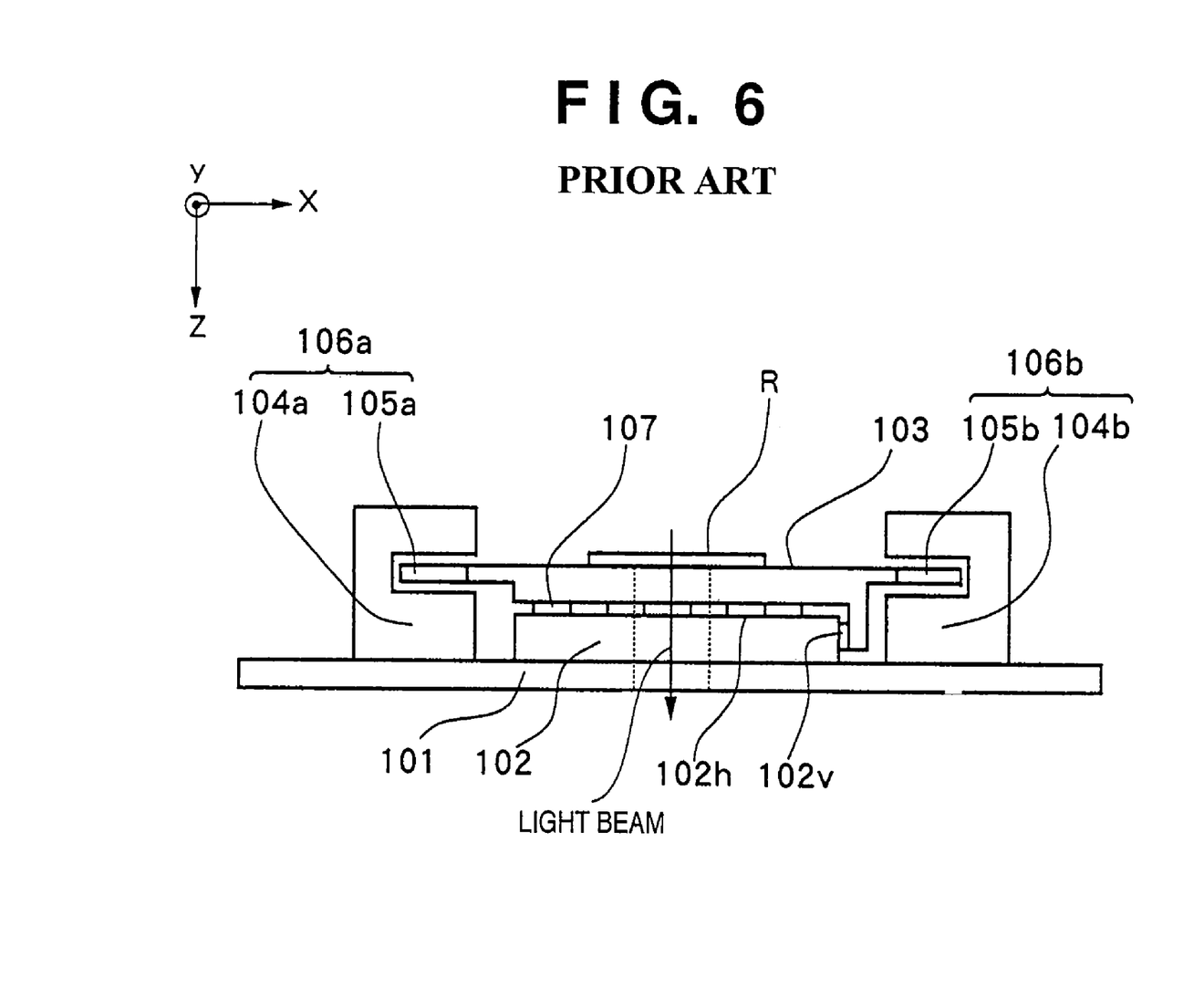
FIG. 6 is a view showing the schematic arrangement of a conventional movable stage apparatus.

Currently, as the semiconductor devices shrink in feature size and increase in integration density, a projection exposure apparatus or a so-called stepper, and a so-called scanning type exposure apparatus have been widely used. The projection exposure apparatus moves the irradiation region of the exposure light to expose the exposure regions of a reticle. The scanning type exposure apparatus projects a reticle pattern onto a limited band-like rectangular or arcuate region on a wafer, and scans a reticle and the wafer synchronously in a one-dimensional direction, so that the reticle pattern is transferred onto the wafer. The movable stage apparatus described above generally uses linear motors as its driving source. FIG. 6 shows a conventional movable stage apparatus (Japanese Patent Laid-Open No. 10-12539) mounted on the scanning type projection exposure apparatus described above.

The conventional movable stage apparatus is constituted by a guide 102 fixed on a reticle base 101, a reticle stage 103 reciprocally movable in a Y-axis direction (the scanning direction of the reticle stage will be defined as the Y-axis; to be referred to as the Y-axis direction hereinafter) along the guide 102, and a pair of linear motors 106a and 106b arranged on the two sides of the reticle stage 103 along its traveling path to accelerate and decelerate the reticle stage 103 in the Y-axis direction. The reticle stage 103 is guided by a hydrostatic bearing (air slide) 107 and a preload mechanism not in contact with a guide surface.

A reticle R is chucked on the reticle stage 103, and a projection optical system (not shown) is provided under the reticle stage 103. A wafer is held by a wafer stage (not shown). The wafer stage also has a driving mechanism similar to that of the reticle stage 103, and is controlled in the same manner as is the reticle stage 103.

In general, the resolution of an exposure apparatus is mainly determined by a wavelength $\lambda$ of an exposing illumination light source and a numerical aperture NA of a projection optical system. More specifically, the shorter the wavelength $\lambda$ of the exposing illumination light source to be used or the larger the numerical aperture NA of the projection optical system, the higher the resolution becomes. Therefore, the wavelength of the exposing illumination light source used in the exposure apparatus decreases year by year, and the numerical aperture NA of the projection optical system increases.

In a current mainstream exposure apparatus, a KrF excimer laser ($\lambda$=248 nm) or an ArF excimer laser ($\lambda$=193 nm) is used as the exposing illumination light source. An exposure apparatus that uses an $F_2$ laser with a shorter wavelength ($\lambda$=157 nm) is also being introduced on a practical level.

To transfer a circuit pattern with a practical minimum line width of 70 nm to 100 nm or less onto a wafer, a light source with a much shorter wavelength is necessary. To meet the above demand, an EUV (Extreme Ultraviolet) exposure apparatus, which uses EUV light with a wavelength $\lambda$ of about 13 nm, which is shorter than even that of the exposure illumination light source described above by one or more orders of magnitude, has been attracting attention.

SUMMARY OF THE INVENTION

A reticle stage as a master stage for an exposure apparatus that uses EUV light as the exposure light has the following problems to be solved.

EUV light is greatly absorbed by materials. Hence, on a reticle or a mask as a transmitting master, the exposure energy reaching a wafer as a photosensitive substrate decreases greatly due to light absorption by the master. For this reason, in the EUV exposure apparatus, use of a reticle or a master as a reflecting master has been considered.

When a reflecting master is mounted on a conventional stage, as shown in FIG. 6, as the master is irradiated with EUV light from a lower portion in FIG. 6, and an opening through which the EUV light passes must be formed in the guide. This makes an EUV optical system complicated, and accordingly, a guide or motor should not interfere with the EUV light. This is not preferable as an exposure apparatus.

The present invention has been made to solve these problems, and has as its object to provide a preferable stage apparatus on which a reflecting master is to be mounted. It is another object of the present invention to provide an EUV exposure apparatus which can suitably use a reflecting master.

In order to achieve the above objects, according to the first aspect of the present invention, a movable stage apparatus comprises a master stage on which a reflecting master is to be mounted, wherein when a space is divided by a plane including a reflection surface of the master, a guide surface to guide movement of the master stage is arranged in a space opposite to a space where an exposure light beam to be reflected by the master passes.

According to the second aspect of the present invention, an exposure apparatus comprises the movable stage apparatus described above.

According to the third aspect of the present invention, a device manufacturing method includes steps of applying a photosensitive material to a substrate, transferring a pattern by the exposure apparatus described above to the photosensitive material on the substrate coated with the photosensitive material, and developing the substrate on which the pattern has been transferred.

Other features and advantages besides those discussed above shall be apparent to those skilled in the art from the description of a preferred embodiment of the invention which follows. In the description, reference is made to the accompanying drawings, which form a part hereof, and which illustrate an example of the invention. Such an example, however, is not exhaustive of the various embodiments of the invention,

DETAILED DESCRIPTION OF THE PREFERRED EMBODIMENTS

The preferred embodiments of the present invention will be described.

First, the outline of the preferred embodiments will be described.

A movable stage apparatus according to an embodiment of the present invention is characterized in that, when the space is divided by a plane including the reflection surface of a reticle as a master, a guide surface is formed in a space opposite to a space where an exposure light beam passes.

The movable stage apparatus desirably has a coarse/fine movement separate type stage including a coarse movement stage which reciprocally moves on a guide surface formed on a base in the scanning direction along the guide in a noncontact manner, and a fine movement stage having a six-axis alignment mechanism.

Desirably, the stators of linear motors as thrust generating mechanisms for the coarse movement stage and fine movement stage are supported in a noncontact manner with the base and are driven in a noncontact manner. The linear motor stators desirably have counter mass mechanisms that move in a direction opposite to the driving direction of the coarse movement stage when the coarse movement stage is driven.

Desirably, the fine movement stage is supported in a noncontact manner with the coarse movement stage, and has an electromagnet which transmits a force, generated upon acceleration and deceleration of the coarse movement stage, to the fine movement stage not in contact with it.

Desirably, the fine movement stage is supported in a noncontact manner with the coarse movement stage by a six-axis alignment mechanism which can perform six-axis alignment control of the coarse movement stage by a fine movement linear motor, and by a self weight support mechanism which supports the weight of the fine movement stage, and is driven and aligned in a noncontact manner.

When alignment control of the fine movement stage by the six-axis alignment mechanisms is not performed, the fine movement stage may drop due to its own weight. Hence, a magnetic force generated by the self weight support mechanism desirably, constantly attracts the fine movement stage to the coarse movement stage with a force larger than the self weight of the fine movement stage. When the fine movement stage is attracted to the coarse movement stage by the magnetic force, the position and posture of the fine movement stage are desirably held by an abutting section by means of kinematic coupling in which three spherical bodies engage with a circular conical groove, a V-groove, and a flat surface, respectively.

Alignment by means of kinematic coupling is desirably used as initial alignment of a laser interferometer, or the like.

Desirably, a mounted interferometer for measuring a Z position, ωx position (rolling), and ωy position (pitching), a short mirror for measuring the Y position and ωz position (yawing), and a long mirror for measuring the X position are mounted on a base vibration-insulated from a base that supports a reticle stage.

An exposure apparatus that has the movable stage described above, and the manufacture of semiconductor devices and display devices using the exposure apparatus are also within the scope of the present invention.

In the embodiments constituted as described above, when the space is divided by a plane including the reticle reflection surface, the guide surface of the reticle stage where a reflecting reticle is to be mounted is formed in a space opposite to a space where the exposure light beam passes. Thus, the optical system can be disposed freely and easily. Since the guide member of the reticle stage need not have an opening where the exposure light beam passes, an increase in rigidity and accuracy of the guide portion can be realized.

The fine movement stage is supported in a noncontact manner with the coarse movement stage by the self weight support mechanism using magnetic elements and the six-axis alignment mechanism using the fine movement linear motor. When alignment control by the linear motor is not performed, the fine movement stage may drop due to its own weight. Hence, the magnetic force generated by the self weight support mechanism is constantly set to be larger than the weight of the fine movement stage, so that heat generated by a Z-axis actuator in the direction of the self weight can be decreased, and dropping of the fine movement stage can be prevented.

When the fine movement stage is attracted to the coarse movement stage by the magnetic force, it is abutted against and held by an alignment section by means of kinematic coupling. Thus, this alignment serves as aligning the initial position of the laser interferometer, or the like.

A position measuring mirror which may decrease the alignment accuracy of the fine movement stage is formed not on the top plate of the fine movement stage, but on the base, which is vibration-insulated from the base that supports the reticle stage and which supports the projection optical system. Thus, an increase in the accuracy of the fine movement stage can be realized.

The embodiments of the present invention will be described in detail.

First Embodiment

Figure 1:
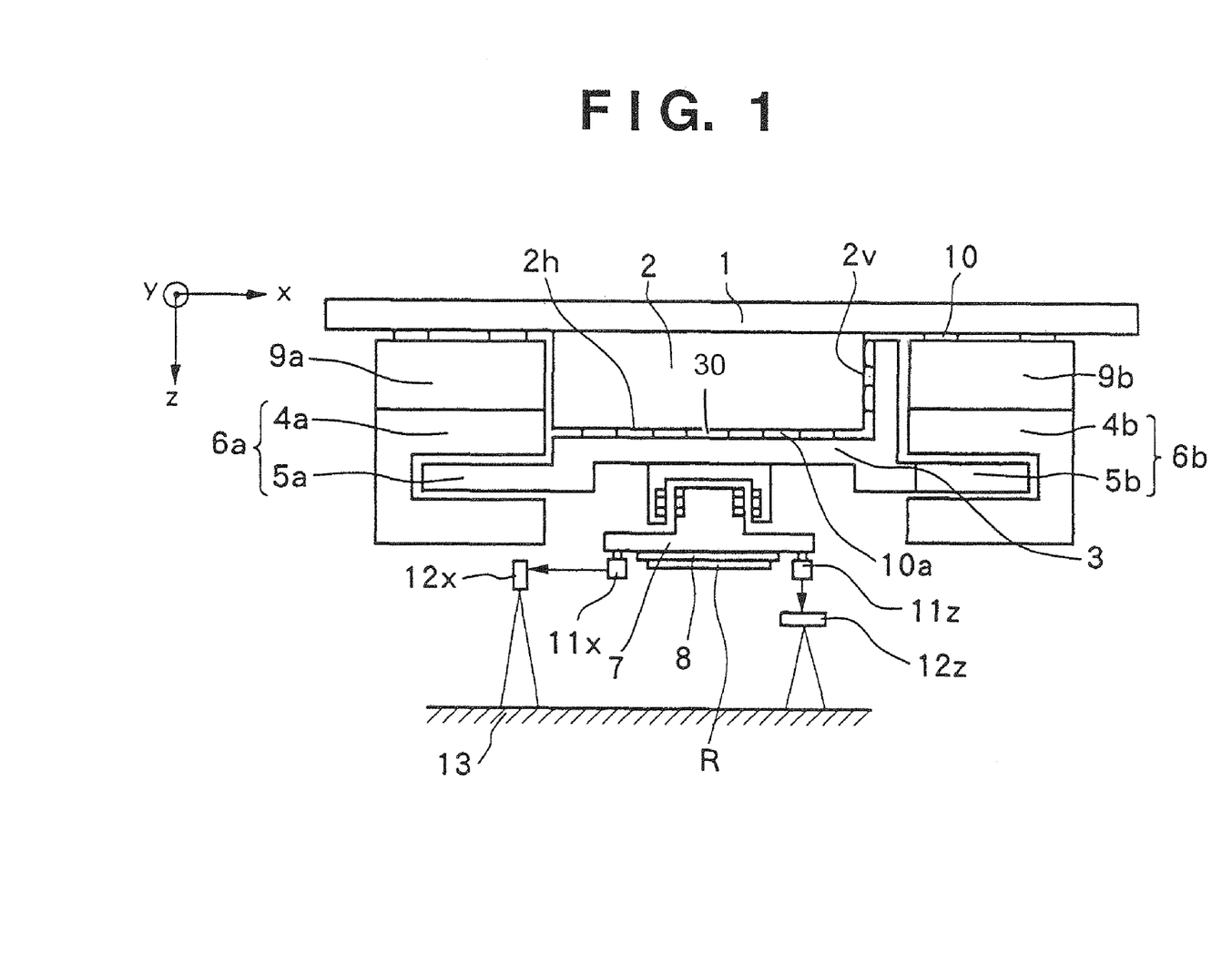
FIG. 1 is a view showing the schematic arrangement of a movable stage apparatus according to the first embodiment.

FIG. 1 is a view showing the schematic arrangement of a movable stage apparatus according to the first embodiment of the present invention.

The movable stage apparatus according to this embodiment has a reticle base 1, a flat plate-like guide 2 as a guide means fixed on the reticle base 1, a coarse movement stage 3 reciprocally movable along the guide 2 in the Y-axis direction (the scanning direction and non-scanning direction of the reticle stage are defined as Y- and X-axes, respectively, and will be respectively referred to as the Y- and X-axis directions hereinafter), a pair of linear motor stators 4a and 4b arranged on the two sides of the coarse movement stage 3 along its traveling path, and a pair of linear motor movable elements 5a and 5b integrally formed with the two side surfaces of the coarse movement stage 3. The linear motor stators 4a and 4b and the linear motor movable elements 5a and 5b make up a pair of linear motors 6a and 6b as a means for accelerating and decelerating the coarse movement stage 3 in the scanning direction. The linear motors 6a and 6b on the two sides are controlled independently of each other, thus enabling alignment in the rotational direction about the optical axis (the direction of the optical axis is defined as the Z-axis direction, and will be referred to as the Z-axis direction hereinafter). A fine movement stage 7 having alignment mechanisms of six-axis directions, i.e., alignment in X-, Y-, and Z-axis directions and rotations ωx, ωy, and ωz about the X-, Y-, and Z-axes, respectively, is mounted on the coarse movement stage 3 in a noncontact manner with it. In the following description, the integrated body of the coarse movement stage 3 and fine movement stage 7 put together will be called a reticle stage.

A reticle R is held by a reticle chuck 8 on the top plate of the fine movement stage 7. When the space is divided by a plane including the reticle reflection surface (pattern surface), the driving point of the guide surface 2 of the reticle stage and that of the coarse movement stage 3 are formed in a space opposite to a space where the exposure light beam passes.

Figure 4:
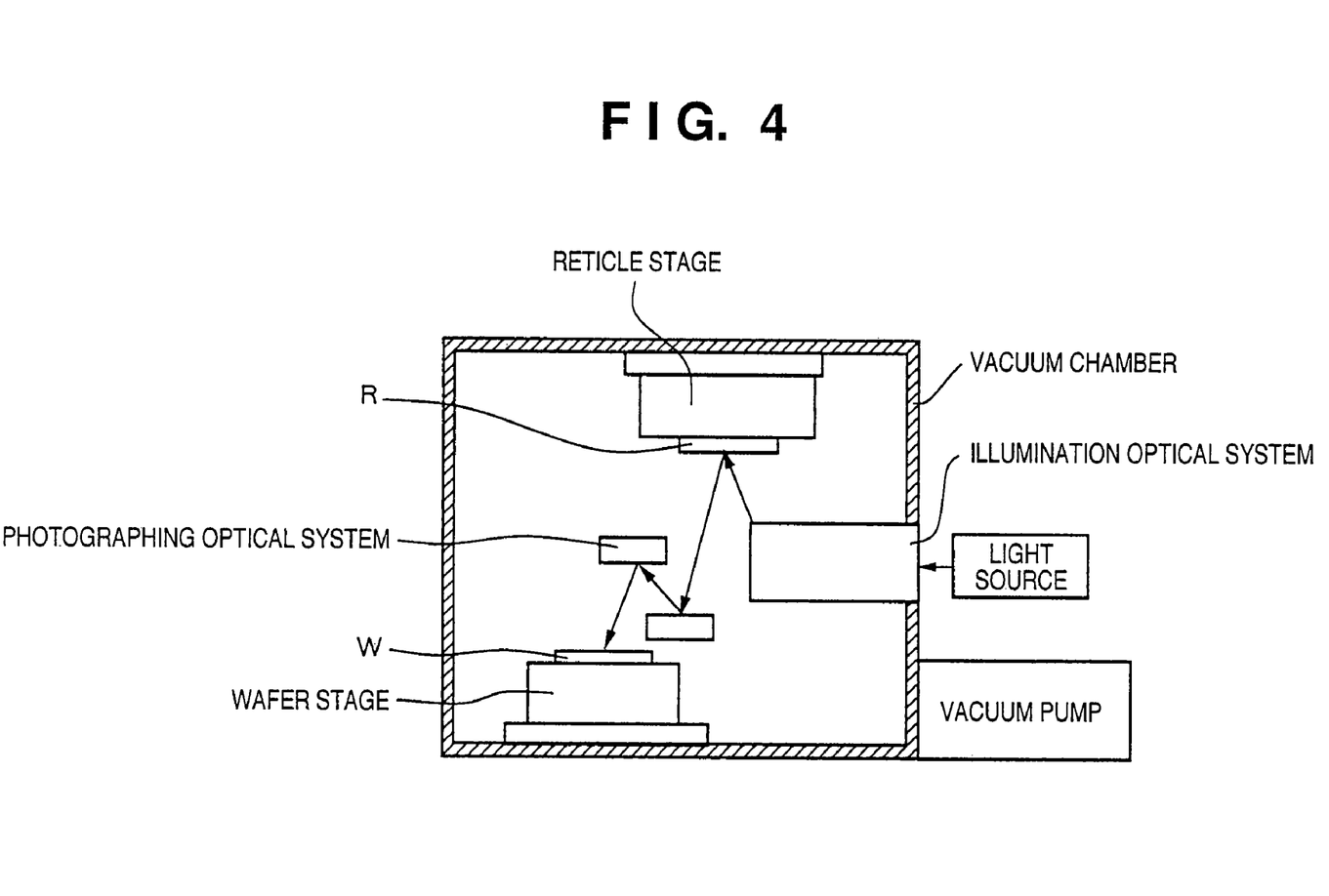
FIG. 4 is a view showing the schematic arrangement of a scanning type exposure apparatus which uses a movable stage apparatus according to the first or second embodiment.

Below the reticle stage, a wafer W as an exposure target body is held by a wafer stage, as shown in FIG. 4. The wafer stage also has a driving section similar to that of the reticle stage, and is controlled in the same manner as is the reticle stage. Band-like exposure light, which irradiates a portion of the reticle, forms an image on the wafer W through a projection optical system constituted by reflection mirrors, and exposes the band-like region of the wafer W, thus transferring a reticle pattern. A mechanism that transfers the entire reticle pattern to the wafer by causing the reticle stage and wafer stage to travel synchronously is identical to that in the conventional projection exposure apparatus. At this time, the traveling positions of the reticle stage and wafer stage are detected by the interferometers, and are fed back to the respective driving sections. Acceleration and deceleration of the reticle stage during exposure are the same as those in the conventional case.

The coarse movement stage 3 has, on the guide 2, flat surfaces 2h and 2v serving as a reference when it reciprocally moves. The flat surface 2h is a surface parallel to the X-Y plane. The flat surface 2v is a surface parallel to the Y-Z plane.

The coarse movement stage 3 is supported and guided by a hydrostatic bearing 10a in noncontact with the reference surface 2 formed on the guide side surface. The coarse movement stage 3 also has a preload mechanism for generating an attracting force between the guide upper surface 2h and side surface 2v. When a permanent magnet 30 is used as the preload mechanism, the base is limited to a magnetic body. When a vacuum suction mechanism is used as the preload mechanism, the base is limited to a magnetic body. When a vacuum suction mechanism is used as the preload mechanism, the material of the base is not particularly limited. The noncontact support mechanism is not limited to one using a hydrostatic bearing, but can be a magnetic levitated type support mechanism using a Lorentz force or a reactance force.

The linear motor stators 4a and 4b arranged on the two sides of the coarse movement stage 3 along its traveling path are supported and guided by a hydrostatic bearing 10 in a noncontact manner with the guide surface formed on the base 1, in the same manner is as the coarse movement stage 3 described above, and have counter masses 9a and 9b, respectively.

With the above arrangement, when the coarse movement stage 3 is driven in the Y-axis (scanning) direction, the linear motor stators 4a and 4b move in a direction opposite to the moving direction of the coarse movement stage 3 due to the reaction force generated upon driving the coarse movement stage 3. At this time, the moving amounts of the linear motor stators 4a and 4b are determined by the ratio in mass of the coarse movement stage 3 to the linear motor stators 4a and 4b. The driving reaction force generated upon driving the coarse movement stage 3 is thus canceled, so that the main body structure that supports the base 1 does not vibrate largely. As the position of the total barycenter of the coarse movement stage 3 and linear motor stators 4a and 4b does not move in the scanning direction, the main body structure does not deform. The pair of left and right linear motors 6a and 6b are independent of each other. Even when control in the rotational direction about the Z-axis is performed, as the barycenters and the driving points of the counter masses 9a and 9b coincide, no rotational force is generated in the counter masses 9a and 9b, and no reaction force in the rotational direction is transmitted to the structure that the counter masses 9a and 9b support. The linear motors 6a and 6b, i.e., the guide mechanisms of the counter masses 9a and 9b need only transmit a reaction force in the scanning-axis (Y-axis) direction.

The position measurement of the fine movement stage will be described.

A mounted interferometer 11z for measuring a Z position, ωx position (rolling), and ωy position (pitching), a mounted interferometer (not shown) for measuring a Y position and an ωz position (yawing), and a mounted interferometer 11x for measuring an X position are mounted on the fine movement stage 7, and a long mirror 12z for measuring the Z position, ωx position, ωy position, a short mirror (not shown) for measuring the Y position and ωz position (yawing), and a long mirror 12x for measuring the X position are mounted on another base 13 vibration-insulated from the base 1 that supports the reticle stage. Hence, the positions in six degrees of freedom of the fine movement stage 7 are measured.

According to the above arrangement, the long mirrors, which decrease the positioning accuracy of the fine movement stage 7 by vibration, are arranged not on the fine movement stage 7, but on the base 13 that supports the projection optical system vibration-insulated from the base 1 that supports the reticle stage. Thus, an increase in accuracy of the fine movement stage 7 can be realized.

The relationship between the coarse movement stage 3 and fine movement stage 7 will be described with reference to FIGS. 2 and 3.

Figure 2:
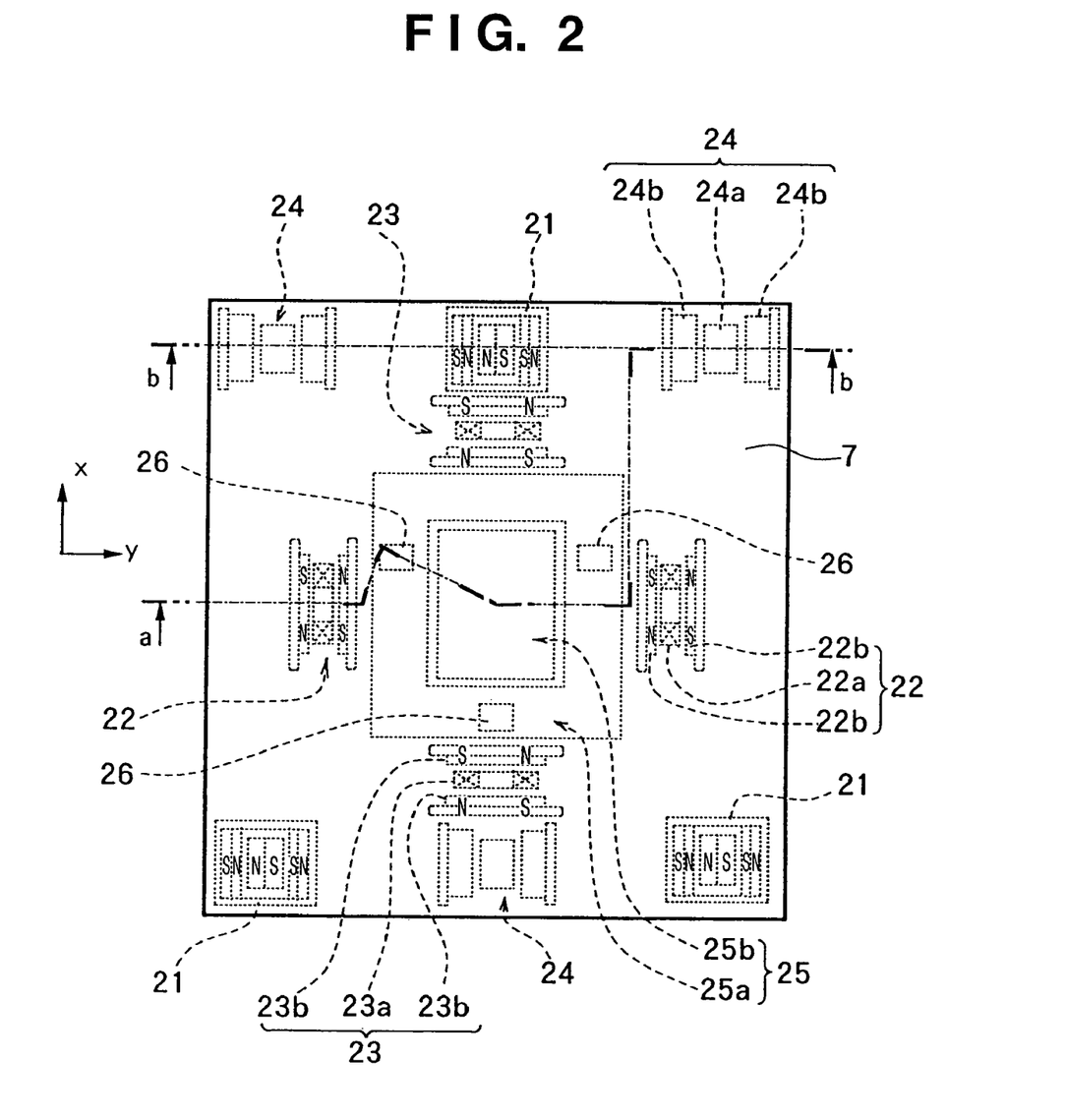
FIG. 2 is a schematic view showing the relationship between a coarse movement stage and a fine movement stage in the movable stage apparatus according to the first embodiment.
Figure 3A:
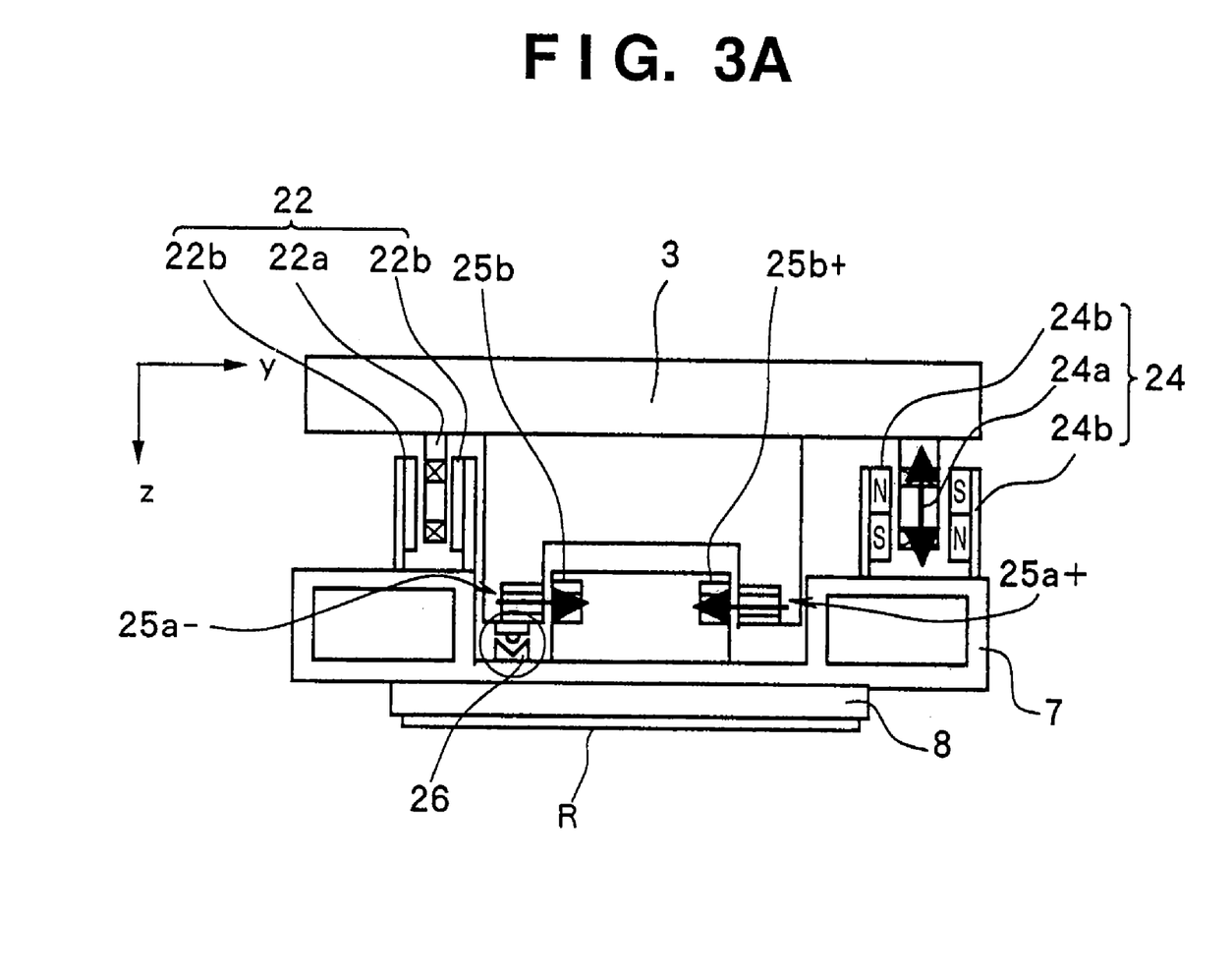
FIG. 3A is a view showing a section taken along the line a-b of FIG. 2.
Figure 3B:
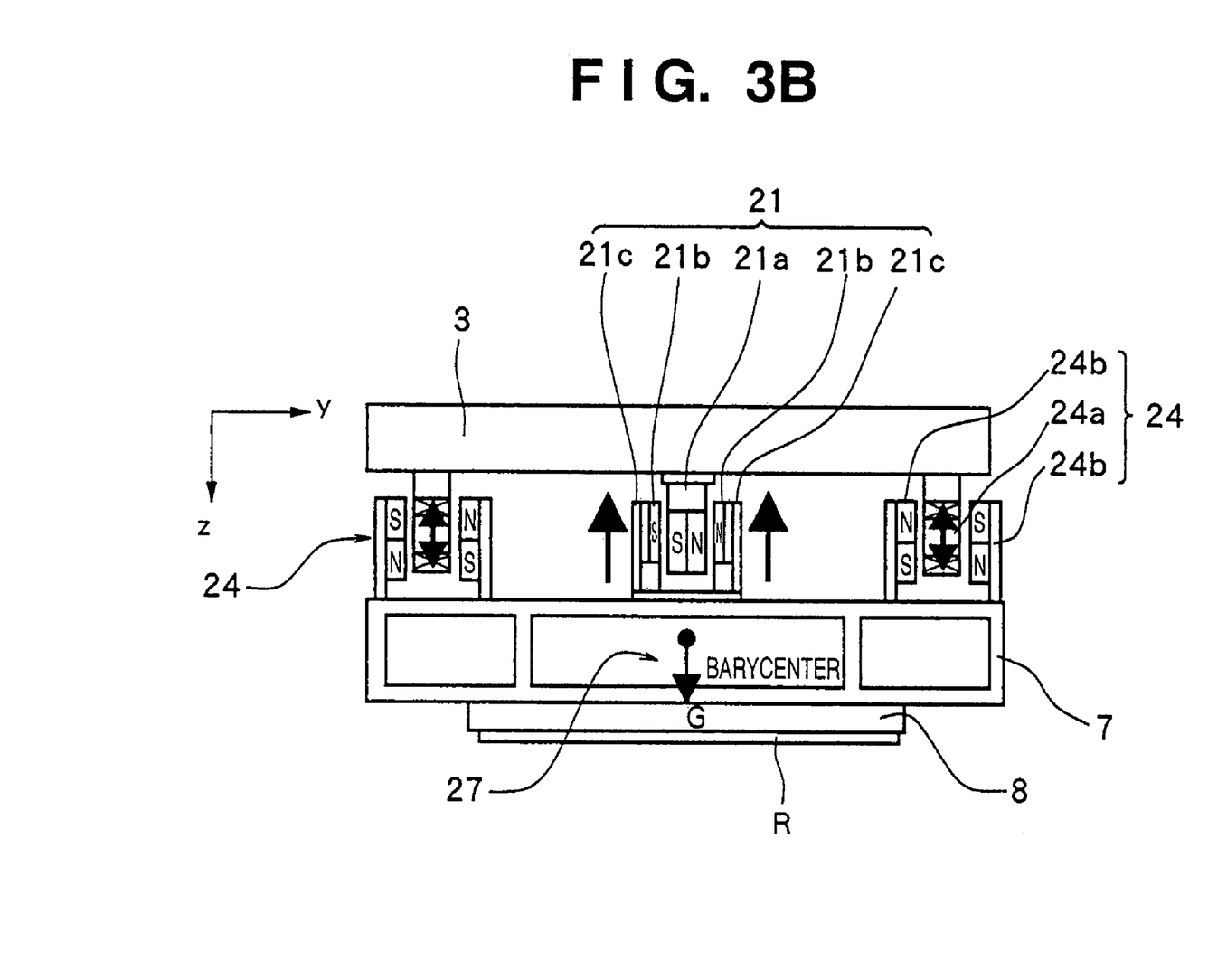
FIG. 3B is a view showing a section taken along the line b-b of FIG. 2.

FIG. 2 is a plan view of the movable stage apparatus of the embodiment shown in FIG. 1 in a direction perpendicular to the reticle R. FIG. 3A is a sectional view taken along the line a-b of FIG. 2, and FIG. 3B is a sectional view taken along the line b-b of FIG. 2.

In the movable stage apparatus according to this embodiment, self weight support mechanisms 21, which support a self weight 27 of the fine movement stage 7, six-axis alignment mechanisms 22, 23, and 24, electromagnets 25, which transmit the forces generated in the linear motors 6a and 6b upon accelerating or decelerating the coarse movement stage 3 in the Y-axis direction, and alignment sections 26 using kinematic coupling are arranged between the fine movement stage 7 and coarse movement stage 3.

The fine movement stage 7, which can be aligned in the six-axis directions, is mounted in a noncontact manner with the coarse movement stage 3 in the direction of gravity (lower side). Since the fine movement stage 7 is supported in a noncontact manner with the coarse movement stage 3, the behavior (vibration) of the coarse movement stage 3 is not transmitted to the fine movement stage 7.

An actuator that performs alignment in the six-axis directions requires noncontact driving and high-accuracy alignment, and, accordingly, desirably uses the convenience of wiring, or the like, coils are desirably provided to stationary sides (coarse movement stage sides) 22a, 23a, and 24a, and permanent magnets are desirably provided to movable sides (fine movement stage sides) 22b, 23b, and 24b.

As the linear motors, the X-direction fine movement linear motors 22 to drive the fine movement stage 7 in the X-axis direction, the Y-direction fine movement linear motors 23 to drive the fine movement stage 7 in the Y-axis direction, and the Z-direction fine movement linear motors 24 to drive the fine movement stage 7 in the Z-axis direction are provided. According to this embodiment, the X-direction fine movement linear motors 22 include two motors 22, and the Y-direction fine movement linear motors 23 include two motors 23. With this arrangement, the fine movement stage 7 can be moved not only in the directions of the respective axes, but can also be driven in the rotational direction ωz about the Z-axis. The Z-direction fine movement linear motors 24 include three motors 24. Thus, the fine movement stage 7 can be moved not only in the Z direction, but can also be driven in the tilt directions (ωx and ωy).

In this embodiment, seven fine movement linear motors are used as the six-axis alignment mechanisms for the fine movement stage 7. However, the present invention is not limited to this arrangement, but can employ any other arrangement, as long as it can generate thrusts in the six-axis directions.

The initial position of the fine movement stage 7, with respect to the coarse movement stage 3, is determined by the alignment sections 26 by means of kinematic coupling. The alignment sections 26 include three spherical bodies equidistant in the circumferential direction. The spherical bodies engage with a circular conical groove, a V-groove, and a flat surface, respectively. Thus, the positions of the fine movement stage 7 in the six-axis directions are constrained, and the posture of the fine movement stage 7, with respect to the coarse movement stage 3, is determined.

An electromagnetic coupling will be described with reference to FIG. 3A.

In this embodiment, the fine movement linear motors 22 and 23 in the X- and Y-axis directions for the coarse movement stage 3 serve to align slightly, and generate small thrusts, so that they cannot apply thrusts as they are over a long distance.

In view of this, E-shaped electromagnets 25a, which transmit forces generated by the linear motors 6a and 6b upon accelerating or decelerating the coarse movement stage 3 in the Y-axis direction to the fine movement stage 7 in a noncontact manner, are arranged at the center of the coarse movement stage 3 to be perpendicular to the Y-axis direction. Magnetic blocks 25b corresponding to the E-shaped electromagnets 25a are provided to the center of the fine movement stage 7. The electromagnets can be of any type as long as they can generate an attracting force for a magnetic body when currents are supplied to the coils of the electromagnets, and are not limited to the E-shaped ones as in this embodiment.

Only attracting forces are generated between the electromagnets 25a and magnetic blocks 25b regardless of the directions of the currents supplied to the coils of the electromagnets. When an electromagnet that generates an attracting force in a positive driving direction and an electromagnet that generates an attracting force in a negative driving direction are provided to form a pair, a large attracting force is applied in the positive and negative Y-axis directions, so that the force generated upon acceleration or deceleration may be transmitted to the fine movement stage 7 in a noncontact manner with it.

With the above arrangement, the X- and Y-axis fine movement linear motors 22 and 23 need only perform slight position control of the fine movement stage 7, and any current that may substantially generate heat to pose an issue does not flow through the X- and Y-axis fine movement linear motors 22 and 23.

The self weight support mechanisms 21 will be described with reference to FIG. 3B.

Each self weight support mechanism 21 is constituted by a magnet 21a and magnets 21b, the magnetic forces of which act on each other, and yokes 21c. The magnets of the same pole face each other, and thrust forces in the Z-axis direction (forces that lift the fine movement stage 7 toward the coarse movement stage 3) generated between the magnets of the same pole are utilized, so that the weight of the fine movement stage 7 is supported. In order to cancel forces other than those in the Z-axis direction, the facing magnets are arranged to be symmetrical with respect to the Z-axis.

With the above arrangement, the Z-direction fine movement linear motors 24 need not have a function of supporting the weight of the fine movement stage 7, but only need to perform position control exclusively. Therefore, any current that may substantially generate heat to pose an issue does not flow through the Z-direction fine movement linear motors 24.

The magnetic attracting force in the Z-axis direction generated by the self weight support mechanisms 21 is always larger than the weight 27 of the fine movement stage 7.

The fine movement stage 7 supports the coarse movement stage 3 in a noncontact manner with it by the self weigh support mechanisms 21 and the six-axis alignment mechanisms 22, 23, and 24 by means of linear motors. Hence, when position control of the fine movement stage 7 by means of the Z-direction fine movement linear motors 24 is not performed, the fine movement stage 7 may drop due to its own weight.

In view of this, the magnetic attracting force generated by the self weight support mechanisms 21 is set to be always larger than the self weight 27 of the fine movement stage 7. When alignment control of the fine movement stage 7 is not performed, the fine movement stage 7 is attracted to the coarse movement stage 3 by the magnetic attracting force of the self weight support mechanisms 21.

With the above arrangement, the fine movement stage 7 can be prevented from dropping. Also, when the fine movement stage 7 is to be attracted to the coarse movement stage 3 by the magnetic force, it is abutted against and held by the alignment sections 26 by means of kinematic coupling, so that the alignment sections 26 can perform alignment for the initial positions of the laser interferometers, or the like.

Second Embodiment

Figure 5:
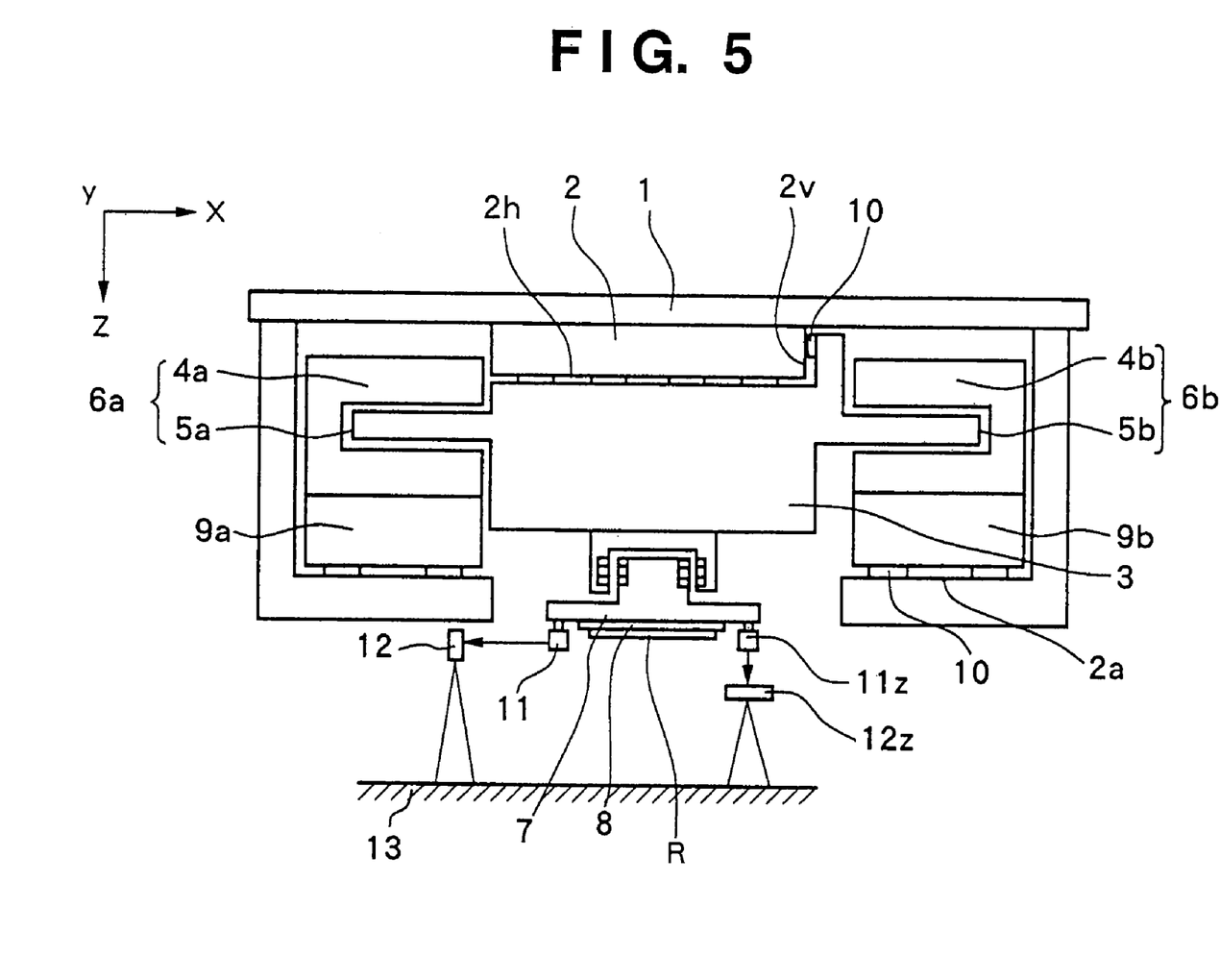
FIG. 5 is a view showing the schematic arrangement of the movable stage apparatus according to the second embodiment.

FIG. 5 is a view showing the schematic arrangement of a movable stage apparatus according to the second embodiment of the present invention.

According to this embodiment, a guide surface 21, which supports a coarse movement linear motor stator 5 and counter mass 9, identical to those of the first embodiment, in a noncontact manner with them, is arranged below them.

With this arrangement, the weight of the coarse movement linear motor stator 5 of the coarse movement stage and that of the counter mass 9 act on the guide surface 2a as a preload, so that the preload force generated by a permanent magnet, or the like, can be decreased as compared to the case of the first embodiment.

According to this embodiment, the guide surface 2a, which supports the counter mass 9 of the coarse movement stage in a noncontact manner with it, is integral with a guide surface 2 that supports a coarse movement stage 3 in a noncontact manner with it. The arrangement of the guide surface 2a, which supports the counter mass 9 in a noncontact manner with it, is not particularly limited to this. Alternatively, the counter mass 9 may be supported by another structure vibration-insulated from a structure where the guide surface 2, which supports the coarse movement stage 3 in a noncontact manner with it, is supported.

Except for this, the second embodiment is the same as the first embodiment, and a description thereof will accordingly be omitted.

As described above, according to the embodiments described above, the optical system can be disposed freely and easily without interfering with the optical path where the exposure light beam passes. The guide member of the reticle stage need not have an opening where the exposure light beam passes. Therefore, an increase in rigidity and accuracy of the guide portion can be realized.

Figure 7:
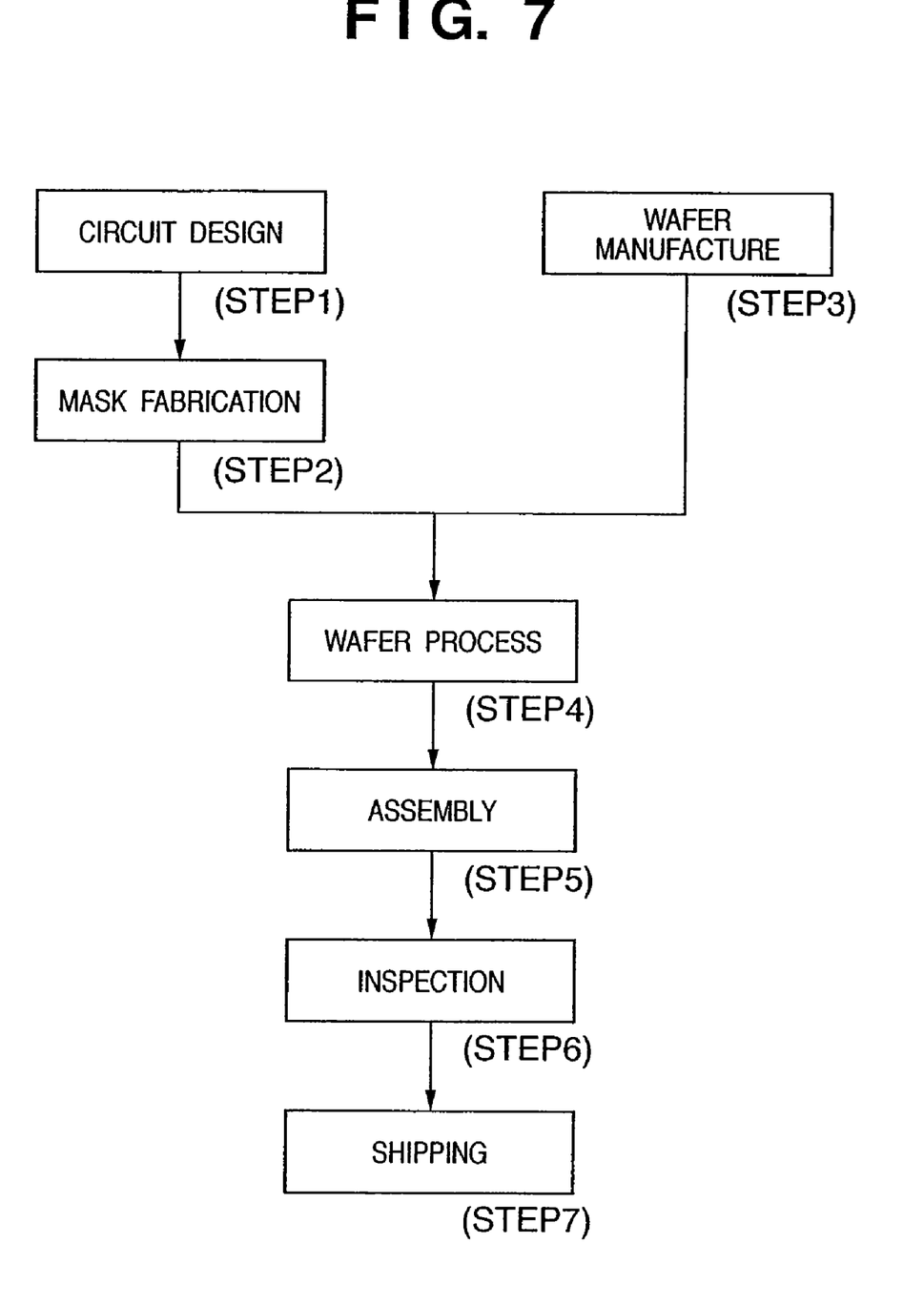
FIG. 7 is a flow chart showing the flow of an overall semiconductor device manufacturing process.

A semiconductor device manufacturing process which utilizes this exposure apparatus will now be described. FIG. 7 is a flow chart showing the flow of an overall semiconductor device manufacturing process.

In step 1 (circuit design), a semiconductor device circuit is designed. In step 2 (mask fabrication), a mask is fabricated based on the designed circuit pattern.

In step 3 (wafer manufacture), a wafer is manufactured using a material such as silicon. In step 4 (wafer process), called a preprocess, an actual circuit is formed on the wafer by lithography using the mask and wafer with the exposure apparatus described above. In step 5 (assembly), called a post-process, a semiconductor chip is formed from the wafer fabricated in step 4. This step includes processes, such as assembly (dicing and bonding) and packaging (chip encapsulation). In step 6 (inspection), inspections, including an operation check test and a durability test of the semiconductor device fabricated in step 5 are performed. A semiconductor device is completed with these processes, and shipped in step 7.

The wafer process of step 4 has the following steps, i.e., an oxidation step of oxidizing the surface of the wafer, a CVD step of forming an insulating film on the wafer surface, an electrode formation step of forming an electrode on the wafer by deposition, an ion implantation step of implanting ions into the wafer, a resist processing step of applying a photosensitive agent to the wafer, an exposure step of transferring the circuit pattern to the wafer after the resist processing step with the exposure apparatus described above, a developing step of developing the wafer exposed in the exposure step, an etching step of etching portions other than the resist image developed in the developing step, and a resist stripping step of stripping any unnecessary resist after etching. By repeating these steps, a multilayered structure of circuit patterns is formed on the wafer.

As has been described above, according to the above embodiments, a space including the guide surface of the reticle stage may not interfere with the exposure light beam.

The present invention is not limited to the above embodiments and various changes and modifications can be made within the spirit and scope of the present invention. Therefore, to apprise the public of the scope of the present invention, the following claims are made.

What is claimed is:

1. An exposure apparatus comprising:
   a reticle stage that moves while holding a reflection reticle such that a reflection surface of the reflection reticle faces downward, said reticle stage including a coarse movement stage which is driven in a scanning direction and a fine movement stage which is arranged at vertically lower position relative to the coarse movement stage and moves in six-axial directions;
   a wafer stage that moves while holding a wafer such that a wafer holding surface faces vertically upward;
   a first linear motor that drives the coarse movement stage including a stator;
   a second linear motor that drives the fine movement stage;
   an alignment section, arranged between the coarse movement stage and the fine movement stage, for positioning the fine movement stage relative to the coarse movement stage;
   a first guide member including a first guide surface for guiding movement of the coarse movement stage;
   a second guide member including a second guide surface for guiding movement of the stator of said first linear motor;
   a first hydrostatic bearing arranged at a position on the coarse movement stage and opposed to the first guide surface;
   a permanent magnet, arranged at a position on the coarse movement stage and opposing to the first guide surface, that generates a magnetic attraction force to the first guide surface;
   a second hydrostatic bearing arranged at a position on the stator of said first linear motor and opposed to the second guide surface; and
   a support mechanism, arranged between the coarse movement stage and the fine movement stage, that supports a weight of the fine movement stage by a magnetic attraction force,
   wherein the first guide surface of said first guide member faces vertically downward and said first guide member is arranged vertically above the coarse movement stage so that said first guide member does not block light which irradiates the reflection reticle and is reflected by the reflection reticle,
   wherein the second guide surface of said second guide member faces vertically downward and said second guide member is arranged vertically above the stator of said first linear motor so that said second guide member does not block light which irradiates the reflection reticle and is reflected by the reflection reticle, and
   wherein said support mechanism is configured such that the fine movement stage contacts the coarse movement stage in a state that the fine movement stage is positioned via the alignment section by the magnetic attraction force of said support mechanism.

2. The apparatus according to claim 1, wherein the magnetic attraction force of said support mechanism is larger than the weight of the fine movement stage.

3. The apparatus according to claim 1, wherein said alignment section includes a kinematic coupling.

4. The apparatus according to claim 3, further comprising a laser interferometer, wherein said kinematic coupling is used for initial alignment of said laser interferometer.

5. The apparatus according to claim 1, wherein said alignment section, arranged between the coarse movement stage and the fine movement stage, includes a plurality of alignment mechanisms.

6. The apparatus according to claim 1, wherein the stator of said first linear motor has a counter mass mechanism that moves in the direction opposite to the driving direction of said coarse movement stage to cancel a driving reaction force of coarse movement stage.

7. The apparatus according to claim 1, further comprising an electromagnet which transmits a force to said fine movement stage, generated upon acceleration or deceleration of said coarse movement stage, in a noncontact manner with said fine movement stage.

8. The apparatus according to claim 1, wherein said support mechanism supports a weight of said fine movement stage so as to push up said fine movement stage toward said coarse movement stage with a magnetic force.

9. The apparatus according to claim 1, further comprising:

a first interferometer to measure rolling, pitching, and a Z-axis position as a vertical direction of said fine movement stage;

a second interferometer to measure yawing and a Y-axis position perpendicular to the vertical direction of said fine movement stage; and a third interferometer to measure an X-axis position perpendicular to Y and Z axes, wherein each of said first, second and third interferometers are mounted on said fine movement stage.

10. A device manufacturing method including steps of:

exposing a pattern to a substrate using an exposure apparatus according to claim 1; and developing the substrate to which the pattern has been transferred.

* * * * *